(12) United States Patent
Mojumder et al.

(10) Patent No.: US 8,966,418 B2
(45) Date of Patent: Feb. 24, 2015

(54) PRIORITY BASED LAYOUT VERSUS SCHEMATIC (LVS)

(71) Applicants: Niladri Mojumder, San Diego, CA (US); Bipul Paul, Clifton Park, NY (US); Anurag Mittal, Wappingers Falls, NY (US); Werner Juengling, Saratoga Springs, NY (US)

(72) Inventors: Niladri Mojumder, San Diego, CA (US); Bipul Paul, Clifton Park, NY (US); Anurag Mittal, Wappingers Falls, NY (US); Werner Juengling, Saratoga Springs, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/837,763

(22) Filed: Mar. 15, 2013

(65) Prior Publication Data

US 2014/0282330 A1 Sep. 18, 2014

(51) Int. Cl.
*G06F 17/50* (2006.01)

(52) U.S. Cl.
CPC .......... *G06F 17/5081* (2013.01); *G06F 17/505* (2013.01); *G06F 17/5072* (2013.01)
USPC ........... 716/112; 716/123; 716/122; 716/132; 716/136; 703/16

(58) Field of Classification Search
CPC G06F 17/5081; G06F 17/5072; G06F 17/505
USPC ............. 716/112, 123, 122, 132, 136; 703/16
See application file for complete search history.

(56) References Cited

U.S. PATENT DOCUMENTS

| 6,014,506 | A | * | 1/2000 | Hossain et al. | 716/104 |
| 6,075,934 | A | * | 6/2000 | Chiluvuri et al. | 716/122 |
| 6,412,095 | B1 | * | 6/2002 | Tada | 716/122 |
| 6,571,374 | B1 | * | 5/2003 | Runyon et al. | 716/112 |
| 7,458,051 | B2 | * | 11/2008 | Hou et al. | 716/120 |
| 2002/0129325 | A1 | * | 9/2002 | Tanaka | 716/11 |
| 2002/0162086 | A1 | * | 10/2002 | Morgan | 716/18 |
| 2005/0091627 | A1 | * | 4/2005 | Satapathy et al. | 716/12 |
| 2006/0026546 | A1 | * | 2/2006 | Dinter et al. | 716/11 |
| 2006/0031798 | A1 | * | 2/2006 | Dirks et al. | 716/6 |
| 2006/0075370 | A1 | * | 4/2006 | Williams et al. | 716/11 |
| 2006/0277512 | A1 | * | 12/2006 | Kucukcakar et al. | 716/6 |
| 2007/0234264 | A1 | * | 10/2007 | Ono | 716/11 |
| 2008/0184183 | A1 | * | 7/2008 | Kobayashi | 716/9 |
| 2008/0222595 | A1 | * | 9/2008 | Hsin | 716/18 |
| 2008/0235649 | A1 | * | 9/2008 | Izuha | 716/19 |

(Continued)

FOREIGN PATENT DOCUMENTS

JP  2010165969 A  *  7/2010

OTHER PUBLICATIONS

Bipul Paul et al., "Modeling Memory Cell Skew Sensitivity" U.S. Appl. No. 13/490,096, filed Jun. 6, 2013.

*Primary Examiner* — Phallaka Kik
(74) *Attorney, Agent, or Firm* — Ditthavong & Steiner, P.C.

(57) ABSTRACT

An approach for methodology, and an associated system, enabling a prioritizing of devices, circuits, and modules of interest is disclosed. Embodiments include: determining a first electrical layout indicating an electrical performance of a physical layout of an IC design, the first electrical layout indicating a plurality of devices of the physical layout; selecting a subset of the plurality of the devices based on one or more connections of the devices; and generating a second electrical layout indicating the electrical performance of the physical layout, the second electrical layout indicating the selected devices without at least one of the plurality of devices.

12 Claims, 5 Drawing Sheets

(56) References Cited

U.S. PATENT DOCUMENTS

| | | |
|---|---|---|
| 2009/0037851 A1* | 2/2009 | Gray et al. ............... 716/2 |
| 2009/0055787 A1* | 2/2009 | Oh et al. ............... 716/6 |
| 2009/0178013 A1* | 7/2009 | Wang et al. ............... 716/2 |
| 2009/0224356 A1* | 9/2009 | Chandra ............... 257/499 |
| 2009/0254874 A1* | 10/2009 | Bose ............... 716/6 |
| 2011/0107281 A1* | 5/2011 | Sun et al. ............... 716/106 |
| 2011/0219277 A1* | 9/2011 | Jen et al. ............... 714/726 |
| 2011/0265048 A1* | 10/2011 | Kim et al. ............... 716/53 |
| 2011/0289471 A1* | 11/2011 | Anikin et al. ............... 716/132 |
| 2012/0272195 A1* | 10/2012 | Hsuan et al. ............... 716/53 |
| 2012/0286331 A1* | 11/2012 | Aton et al. ............... 257/202 |
| 2013/0205266 A1* | 8/2013 | Chen et al. ............... 716/55 |
| 2014/0019930 A1* | 1/2014 | Yuh et al. ............... 716/115 |
| 2014/0059504 A1* | 2/2014 | Chen et al. ............... 716/55 |

* cited by examiner

```
.SUBCKT SRAM_M1FET_ - PAD_24 PAD_23 PAD_14 PAD_13 PAD_12 PAD_23 PAD_21 PAD_13 PAD_10 PAD_02 PAD_25 PAD_22 PAD_20
M1249 101994 19582 101993 PAD_23 spenfetw1 nf=1 ngcon=1 cpp=8.8e-08 w=7e-08 l=2.8e-08
M1250 101995 19583 101994 PAD_23 spenfetw1 nf=1 ngcon=1 cpp=8.8e-08 w=7e-08 l=2.8e-08
M1251 101997 19584 101996 PAD_23 spenfetw1 nf=1 ngcon=1 cpp=8.8e-08 w=7e-08 l=2.8e-08
M1252 101998 19585 101997 PAD_23 spenfetw1 nf=1 ngcon=1 cpp=8.8e-08 w=7e-08 l=2.8e-08
M1253 102000 19586 101999 PAD_23 spenfetw1 nf=1 ngcon=1 cpp=8.8e-08 w=7e-08 l=2.8e-08
M1254 102001 19587 102000 PAD_23 spenfetw1 nf=1 ngcon=1 cpp=8.8e-08 w=7e-08 l=2.8e-08
M1255 PAD_12 19588 102002 PAD_23 spenfetw1 nf=1 ngcon=1 cpp=8.8e-08 w=7e-08 l=2.8e-08
M1256 PAD_14 PAD_13 PAD_12 PAD_23 spenfetw1 nf=1 ngcon=1 cpp=8.8e-08 w=7e-08 l=2.8e-08
M1257 102004 19589 102003 PAD_23 spenfetw1 nf=1 ngcon=1 cpp=8.8e-08 w=7e-08 l=2.8e-08
M1258 102005 19590 102004 PAD_23 spenfetw1 nf=1 ngcon=1 cpp=8.8e-08 w=7e-08 l=2.8e-08
M1259 102007 19591 102006 PAD_23 spenfetw1 nf=1 ngcon=1 cpp=8.8e-08 w=7e-08 l=2.8e-08
M1260 102008 19592 102007 PAD_23 spenfetw1 nf=1 ngcon=1 cpp=8.8e-08 w=7e-08 l=2.8e-08
M1261 102010 19593 102009 PAD_23 spenfetw1 nf=1 ngcon=1 cpp=8.8e-08 w=7e-08 l=2.8e-08
M1262 102011 19594 102010 PAD_23 spenfetw1 nf=1 ngcon=1 cpp=8.8e-08 w=7e-08 l=2.8e-08
M1263 102013 19595 102012 PAD_23 spenfetw1 nf=1 ngcon=1 cpp=8.8e-08 w=7e-08 l=2.8e-08
M1264 102014 19596 102013 PAD_23 spenfetw1 nf=1 ngcon=1 cpp=8.8e-08 w=7e-08 l=2.8e-08
M1265 102016 19597 102015 PAD_23 spenfetw1 nf=1 ngcon=1 cpp=8.8e-08 w=7e-08 l=2.8e-08
M1266 102017 19598 102016 PAD_23 spenfetw1 nf=1 ngcon=1 cpp=8.8e-08 w=7e-08 l=2.8e-08
M1267 102019 19599 102018 PAD_23 spenfetw1 nf=1 ngcon=1 cpp=8.8e-08 w=7e-08 l=2.8e-08
M1268 102020 19600 102019 PAD_23 spenfetw1 nf=1 ngcon=1 cpp=8.8e-08 w=7e-08 l=2.8e-08
M1269 102022 19601 102021 PAD_23 spenfetw1 nf=1 ngcon=1 cpp=8.8e-08 w=7e-08 l=2.8e-08
M1270 102023 19602 102022 PAD_23 spenfetw1 nf=1 ngcon=1 cpp=8.8e-08 w=7e-08 l=2.8e-08
M1271 102025 19603 102024 PAD_23 spenfetw1 nf=1 ngcon=1 cpp=8.8e-08 w=7e-08 l=2.8e-08
M1272 102026 19604 102025 PAD_23 spenfetw1 nf=1 ngcon=1 cpp=8.8e-08 w=7e-08 l=2.8e-08
M1273 102028 19605 102027 PAD_23 spenfetw1 nf=1 ngcon=1 cpp=8.8e-08 w=7e-08 l=2.8e-08
```

```
.SUBCKT SRAM M1FET 1 PAD 14 PAD 13 PAD 12 PAD 23 PAD 24 PAD 23 PAD 21 PAD 13 PAD 10 PAD 02 PAD 25 PAD 22 PAD 20
M180 PAD 18 PAD 15 PAD 17 PAD 23 spenfetw1 nf=1 nccon=1 pp=8.8e-08 w=7e-08 l=2.8e-03
MS80 PAD_18 PAD_15 PAD_17 PAD_23 spgnfetw1 nf=1 ngcon=1 cpp=8.8e-08 w=8.9e-08 1=2.8e-08
MS81 PAD_16 PAD_15 PAD_18 PAD_23 spgnfetw1 nf=1 ngcon=1 cpp=8.8e-08 w=8.9e-08 1=2.8e-08
.ENDS
```

300b

301

PRIORITY BASED LAYOUT VERSUS SCHEMATIC (LVS)

TECHNICAL FIELD

The present disclosure relates to generating a computer simulation modeling electrical characteristics of integrated circuit (IC) designs. The present disclosure is particularly applicable to IC designs utilizing 32 nanometer (nm) technology nodes and beyond and utilizing a large number of dummy and active devices among a device of interest.

BACKGROUND

In IC designs, computer simulation processes are used to check integrity of the design and predict behavior of a resulting circuit. However, traditional processes generate a netlist from an entire physical chip layout without identifying devices, circuits, and modules of interest. As such, the presence of dummy modules makes computer simulation inefficient and may require a manual review which is time consuming and potentially adds unintended human error.

A need therefore exists for methodology and an associated system enabling a prioritizing of devices, circuits, and modules of interest, particularly in a netlist corresponding to an entire physical chip layout that includes many dummy devices (e.g., devices not of interest).

SUMMARY

An aspect of the present disclosure is a method of selecting a subset of a plurality of the devices based on one or more connections of the devices.

Another aspect of the present disclosure is a system for selecting a subset of a plurality of the devices based on one or more connections of the devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a first electrical layout indicating an electrical performance of a physical layout of an IC design, the first electrical layout indicating a plurality of devices of the physical layout; selecting a subset of the plurality of the devices based on one or more connections of the devices; and generating a second electrical layout indicating the electrical performance of the physical layout, the second electrical layout indicating the selected devices without at least one of the plurality of devices.

Aspects include a method, wherein the first electrical layout indicates a plurality of ports indicated in the physical layout, the method further including: determining whether each of the plurality of devices is connected to one or more of the ports, wherein the selection of the selected devices is further based on the determination of whether each of the plurality of devices is connected to one or more of the ports. Additional aspects include determining whether one of the plurality of devices impacts an electrical characteristic of the selected devices, wherein the second electrical layout is generated to include the one device based on the determination of whether the one device impacts the electrical characteristic of the selected devices. Further aspects include determining whether the one device is an active or passive device, wherein the determination of whether the one device impacts the electrical characteristic of the selected devices is based on the determination of whether the one device is an active or passive device. Some aspects include determining whether the one device contains a parasitic capacitance impacting the electrical characteristic of the selected devices, wherein the determination of whether the one device impacts the electrical characteristic of the selected devices is based on the determination of whether the one device contains the parasitic capacitance. Additional aspects include determining an association between a first sub-circuit of the selected devices and a second sub-circuit, wherein the second electrical layout is generated to include one or more of the plurality of devices based on the second sub-circuit. Further aspects include a method, wherein the ports are bond pads of the IC design, the method further including: determining whether a top level cell of the IC design that includes the first sub-circuit further includes the second sub-circuit, wherein the determined association is based on the determination of whether the top level cell further includes the second sub-circuit. Some aspects include: determining the physical layout based on a third electrical layout for the IC design, the physical layout being configured to have an electrical performance indicated by the third electrical layout; and comparing the second and third electrical layouts. Additional aspects include determining one or more electrical characteristics of a random-access memory (RAM) device of the plurality of devices according to the second electrical layout, the electrical characteristics including a threshold voltage, saturation current, noise margin, trench capacitance, or a combination thereof.

Another aspect of the present disclosure is a system having a first module configured to: generate a first electrical layout indicating an electrical performance of a physical layout for an IC design, the first electrical layout indicating a plurality of devices; and a second module configured to select one or more of the plurality of devices based on one or more connections of the plurality of devices; and generate a second electrical layout indicating an electrical performance of the physical layout, the second electrical layout indicating the selected devices without at least one of the plurality of devices.

Aspects include a system, wherein the first electrical layout indicates a plurality of ports and the second module is further configured to determine whether each of the plurality of devices is connected to one or more of the ports, wherein the selection of the one or more devices is further based on the determination of whether each of the plurality of devices is connected to one or more of the ports. Additional aspects include a system, wherein the second module is further configured to determine whether one of the plurality of devices impacts an electrical characteristic of the selected devices, wherein the second electrical layout includes the one device based on the determination of whether the one device impacts an electrical characteristic of the selected devices. Further aspects include a system, wherein the second module is further configured to determine whether the one device is an active or passive device and/or contains a parasitic capacitance impacting an electrical characteristic of the selected devices, wherein the determination of whether the one device impacts an electrical characteristic of the selected devices is based on the determination of whether the one device is an active or passive device and/or contains the parasitic capacitance. Some aspects include: a third module configured to generate the physical layout based on a third electrical layout, the physical layout being configured to have an electrical performance indicated by the third electrical layout; and a fourth module configured to compare an electrical performance indicated by the second and third electrical layout. Additional aspects include a fifth module configured to determine one or more electrical characteristics of the physical layout based on the second electrical layout. Further aspects include a system, wherein the electrical characteristics include a threshold voltage, saturation current, noise margin, trench capacitance, or a combination thereof of a RAM device of the plurality of devices.

Another aspect of the present disclosure is a method including: determining a first electrical schematic of an IC design; determining a physical layout configured have an electrical performance indicated by to the first electrical schematic, wherein the physical layout indicates a plurality of bond pads and devices, wherein each of the plurality of devices is associated with a top level cell and a sub-circuit of a respective top level cell; generating a first netlist indicating an electrical performance of the physical layout, the first netlist indicating the bond pads and devices; determining a set of the plurality of devices indicated by the first netlist as having one or more functional terminals (e.g., gate, drain, source, body, etc.) connected to one or more of the bond pads; generating a second netlist indicating an electrical performance of the physical layout, the second netlist indicating the set of the plurality of devices without at least one of the plurality of devices; and comparing an electrical performance indicated by the first electrical schematic to an electrical performance indicated by the second netlist.

Some aspects include: determining whether the one device is an active or passive device and/or contains a parasitic capacitance; and determining whether one of the plurality of devices impacts an electrical characteristic of at least one of the plurality of devices in the set based on the determination of whether the one device is an active or passive device and/or contains a parasitic capacitance, wherein the second netlist indicates the one device based on the determination of whether the one device impacts the electrical characteristic. Additional aspects include determining a set of sub-circuits associated with a top level cell associated with at least one device of the set of devices, wherein the second netlist indicates one or more of the plurality of devices based on the set of sub-circuits. Further aspects include determining one or more electrical characteristics of a RAM device of the physical layout based on the second netlist, the electrical characteristics including a threshold voltage, saturation current, noise margin, trench capacitance, or a combination thereof.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A and 3B illustrate a selection of a device of interest from a plurality of devices, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of time consumption and manual review, which in turn engenders human error, attendant upon checking integrity and predicting behavior of select devices, for devices of interest, in IC designs having a large number of dummy and/or devices not of interest on a physical chip layout. The present disclosure addresses and solves such problems, for instance, by, inter alia, selecting a subset of a plurality of the devices based on one or more connections of the devices.

Methodology in accordance with embodiments of the present disclosure includes: determining a first electrical layout indicating an electrical performance of a physical layout of an IC design, the first electrical layout indicating a plurality of devices of the physical layout; selecting a subset of the plurality of the devices based on one or more connections of the devices; and generating a second electrical layout indicating the electrical performance of the physical layout, the second electrical layout indicating the selected devices without at least one of the plurality of devices.

Figure 1:
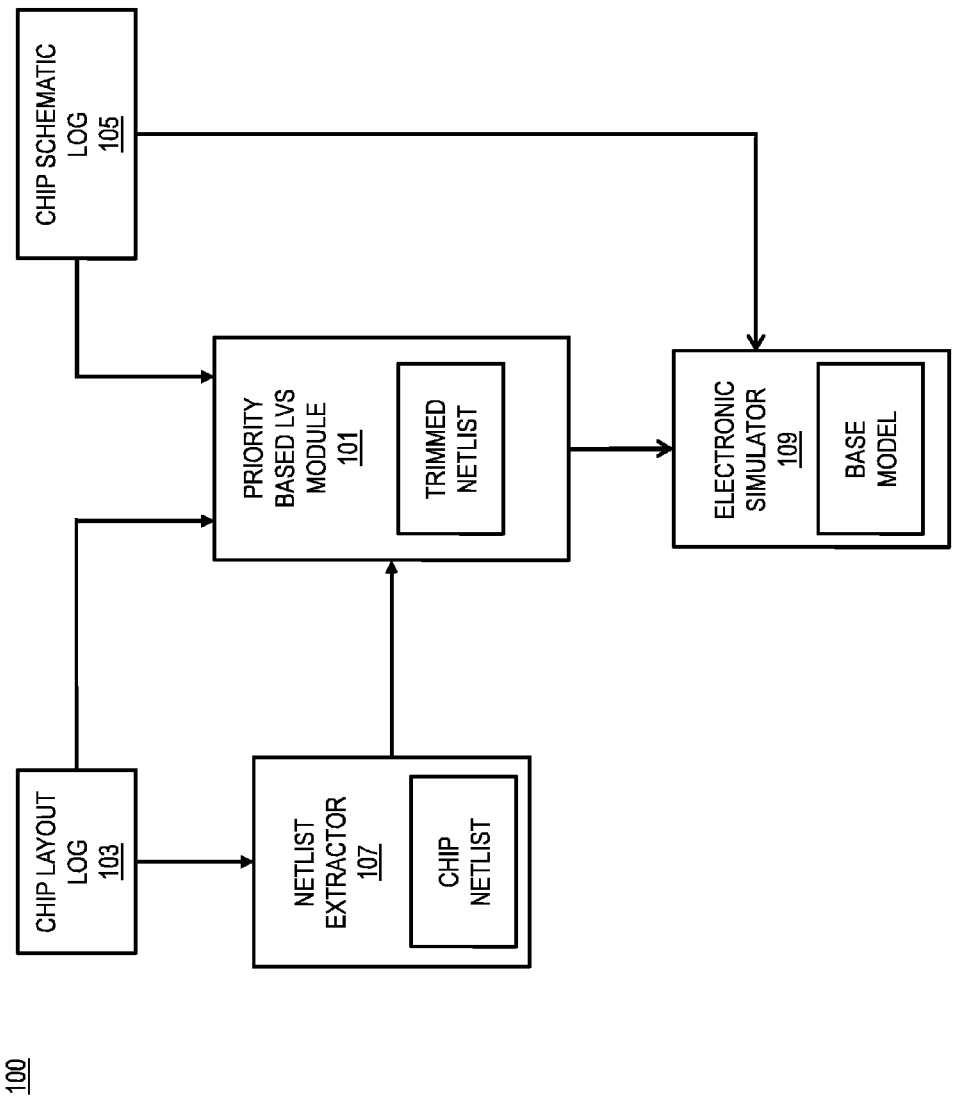
FIG. 1 is a diagram of modules configured to select a subset of a plurality of the devices, in accordance with an exemplary embodiment.

Adverting to FIG. 1, a system 100 includes priority based LVS module 101 having access to chip layout log 103 and chip schematic log 105, a netlist extractor 107, and an electronic simulator 109. Module 101 and extractor 107 and logs 103 and 105 may be combined. Alternatively, module 101, extractor 107, simulator 109, and logs 103 and 105 may be combined.

LVS module 101 is configured to verify that a physical layout for an IC design, retrieved from layout log 103, performs a function indicated by a corresponding schematic for the layout, retrieved from schematic log 105. For instance, the LVS module 101 may determine that a physical layout contains shorts, open connections, device mismatches, and the like, that prevent a fabrication of the layout from performing identically to a corresponding schematic. Additionally, the LVS module 101 may select or prioritize devices in a netlist. For example, the LVS module 101 receives a netlist having a device of interest among many dummy active and dummy passive devices and identifies the device of interest and passive (and/or active) devices impacting a performance of the device of interest. The LVS module 101 may additionally create a trimmed netlist describing the connectivity of an electronic design indicated in a layout and corresponding schematic. For instance, the trimmed list may include only the device of interest and dummy passive (and active) devices impacting a performance of the device of interest.

Netlist extractor 107 is configured to generate a netlist based on a physical layout. For example, the netlist extractor 107 receives a physical layout of an entire chip from chip layout log 103 and determines a netlist identifying each device of the physical layout. The netlist may indicate, for instance, devices of interest, dummy passive devices, dummy active devices, bond pad connections, etc. in a physical layout. The netlist extractor 107 may be a commercial software configured to generate a netlist that includes every device (and connection) of a physical layout for an entire chip design, for instance, a standard EDA package such as CALIBRE or CADENCE utilizing a '.gds', '.gds2', '.oas', '.gl1', or other standard layout form.

Simulator 109 verifies electrical performance of an IC design, and predicts IC behavior. For example, the simulator 109 compares a threshold voltage, saturation current, noise margin, and trench capacitance of a dynamic (or static) RAM device indicated in a (trimmed) netlist (from LVS module 101) to values indicated in a chip schematic (stored in log 105). As illustrated, simulator 109 utilizes a base model (e.g., BSIM4, PSP) configured to accept input in a SPICE netlist form such as '.sp', '.src.net', and '.net'.

Figure 2:
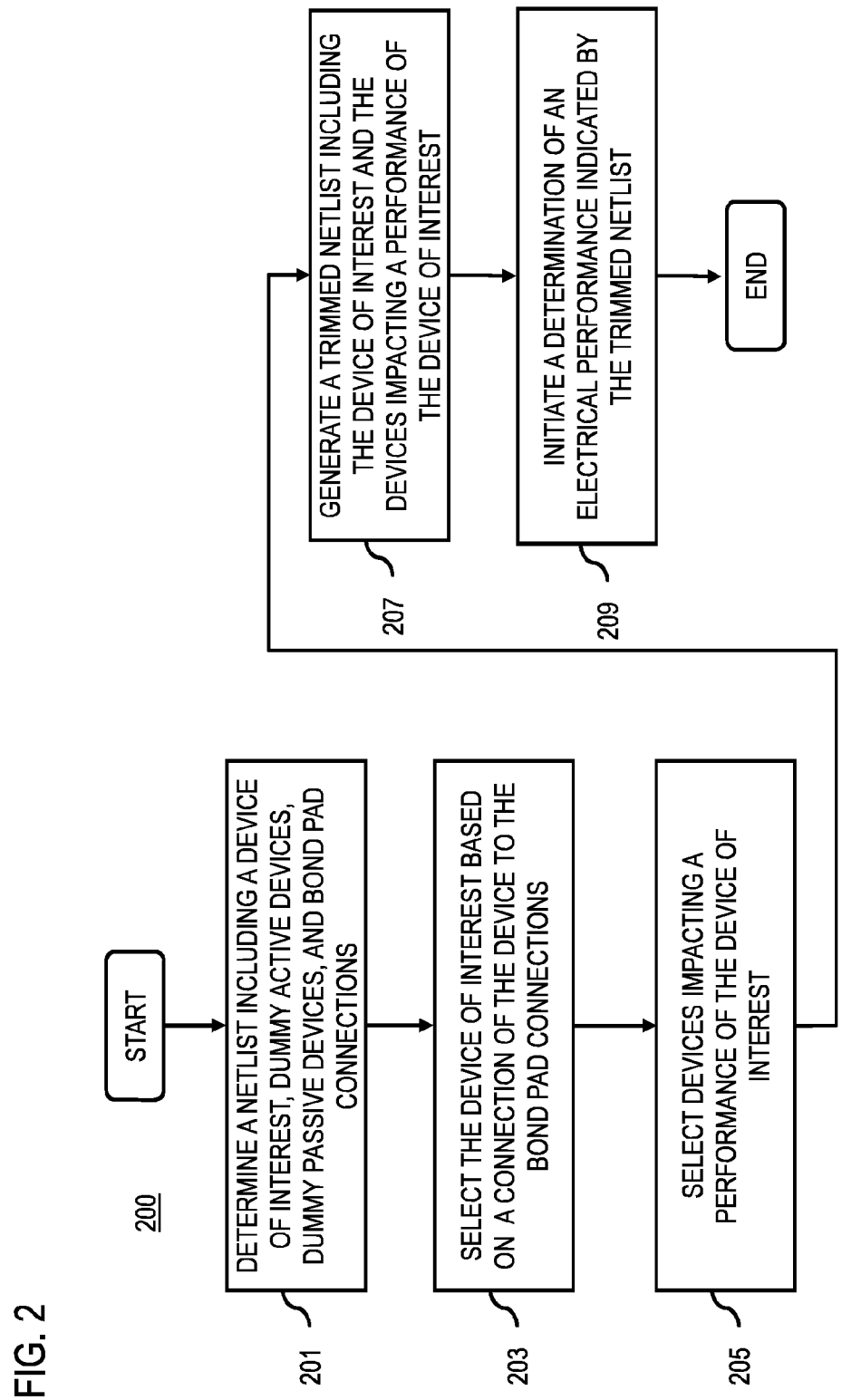
FIG. 2 is a flowchart of a process for selecting a subset of a plurality of the devices, according to an exemplary embodiment.
Figure 4:
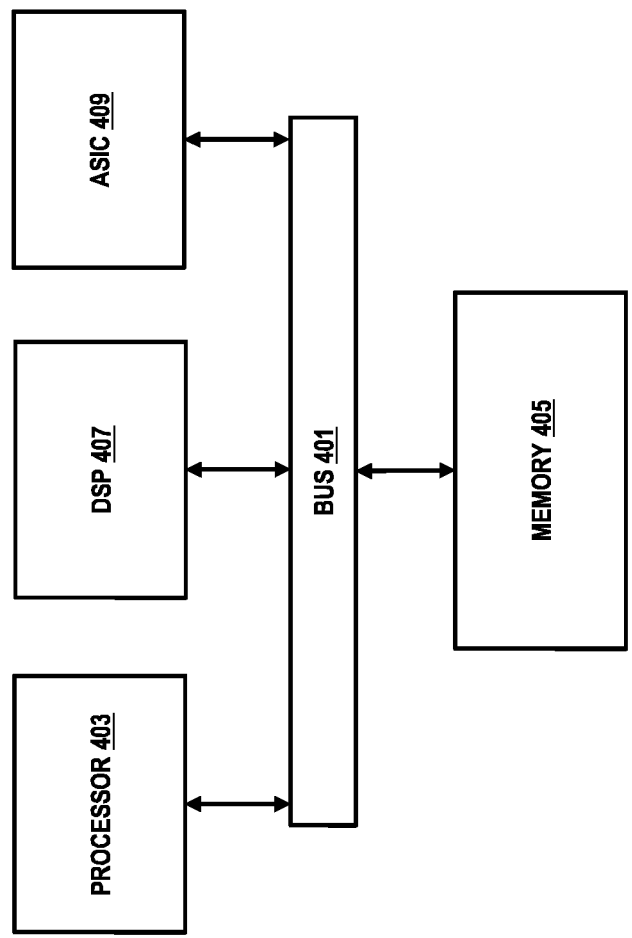
FIG. 4 is a diagram of a chip set that can be used to implement exemplary embodiments.

FIG. 2 is a flowchart of a process 200 for selecting a subset of a plurality of the devices, according to an exemplary embodiment. By way of example, process 200 is explained with respect to system 100 of FIG. 1. Also, process 200 may be implemented in, for instance, a chip set including a processor and a memory as shown in FIG. 4.

In step 201, the LVS module 101 determines a netlist including a device of interest, dummy active devices, dummy passive devices, and bond pad connections. For example, the LVS module 101 receives a netlist extracted by extractor 107 that indicates every device across an entire chip layout of chip layout log 103. The LVS module 101 selects, as in step 203, the device of interest based on a connection of the device to the bond pad connections. For instance, the LVS module 101 selects active devices having a functional terminal directly (or indirectly) connected with one or more bond pad connections of the chip. Next, in step 205, the LVS module 101 selects devices impacting a performance of the device of interest. For instance, the LVS module 101 selects active devices having a parasitic capacitance and a connection with the device of interest and/or dummy passive devices having a connection with the device of interest. In another example, the LVS module 101 determines a top level cell and sub-circuit for the device of interest and selects devices in sub-circuits of the top level cell.

The LVS module 101 then generates, as in step 207, a trimmed netlist that includes the device of interest and devices impacting a performance of the device of interest and initiates, in step 209, a determination of an electrical performance indicated by the trimmed netlist. For instance, the LVS module 101 sends a generated trimmed netlist to simulator 109 to compare an electrical performance of the trimmed list with an electrical performance indicated in chip schematic log 105. In this manner, netlists of chip layouts having devices of interest distributed among many dummy devices, for instance an M×N bond pad set of SRAM bitcells, may be reduced to a trimmed netlist. Such a trimmed list allows an electronic simulation of the selection of devices of interest (and devices impacting performance) without dummy devices, thereby enabling efficient computer simulation without manual review.

FIGS. 3A and 3B illustrate a selection of a device of interest from a plurality of devices, in accordance with an exemplary embodiment. Adverting to FIG. 3A, a device of interest 301 is selected among many devices in a complete netlist 300*a* for an entire chip layout. FIG. 3B illustrates a trimmed netlist 300*b* corresponding to the complete netlist 300*a* that includes the device of interest 301 and excludes dummy devices of the complete netlist 300*a*.

FIG. 4 is a diagram of a chip set that can be used to implement various exemplary embodiments. Chip set 400 is programmed to provide for methodology enabling a prioritizing of devices as described herein and includes, for instance, the processor and memory components described with respect to FIG. 4 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 400, or a portion thereof, constitutes a means for performing one or more steps of FIG. 2.

The chip set 400 may include a communication mechanism such as a bus 401 for passing information among the components of the chip set 400. A processor 403 has connectivity to the bus 401 to execute instructions and process information stored in, for example, a memory 405. The processor 403 may include one or more processing cores with each core configured to perform independently. A multi-core processor enables multiprocessing within a single physical package. Examples of a multi-core processor include two, four, eight, or greater numbers of processing cores. Alternatively or in addition, the processor 403 may include one or more microprocessors configured in tandem via the bus 401 to enable independent execution of instructions, pipelining, and multithreading. The processor 403 may also be accompanied by one or more specialized components to perform certain processing functions and tasks such as one or more digital signal processors (DSP) 407, or one or more application-specific integrated circuits (ASIC) 409. A DSP 407 typically is configured to process real-world signals (e.g., sound) in real time independently of the processor 403. Similarly, an ASIC 409 can be configured to perform specialized functions not easily performed by a general purpose processor. Other specialized components to aid in performing the inventive functions described herein include one or more field programmable gate arrays (FPGA) (not shown for illustrative convenience), one or more controllers (not shown for illustrative convenience), or one or more other special-purpose computer chips.

The processor 403 and accompanying components have connectivity to the memory 405 via the bus 401. The memory 405 includes both dynamic memory (e.g., RAM, magnetic disk, writable optical disk, etc.) and static memory (e.g., ROM, CD-ROM, etc.) for storing executable instructions that when executed perform the inventive steps described herein. The memory 405 also stores the data associated with or generated by the execution of the inventive steps.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

The embodiments of the present disclosure can achieve several technical effects, including electronic computer simulations capable of prioritizing devices in IC designs having dummy and/or devices not of interest on a physical chip layout. The present disclosure enjoys industrial applicability in any of electronic computer simulation of highly integrated semiconductor devices, including logic or high voltage technology nodes from mainstream to advanced devices, particularly in IC designs for 32 nm technology nodes and beyond and in IC designs utilizing a large number of dummy and active devices among a device of interest.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining a first electrical layout indicating an electrical performance of a physical layout of an integrated circuit (IC) design, the first electrical layout indicating a plurality of devices of the physical layout;
   selecting a subset of the plurality of the devices based on one or more connections of the devices;
   determining whether one of the plurality of devices impacts an electrical characteristic of the selected devices based on a determination of whether the one device is an active or passive device; and
   generating, via at least one computer, a second electrical layout indicating the electrical performance of the physical layout, the second electrical layout indicating the selected devices without at least one of the plurality of devices, wherein the second electrical layout is generated to include the one device based on the determination of whether the one device impacts the electrical characteristic of the selected devices.

2. The method according to claim 1, wherein the first electrical layout indicates a plurality of ports indicated in the physical layout, the method further comprising:
   determining whether each of the plurality of devices is connected to one or more of the ports, wherein the selection of the selected devices is further based on the determination of whether each of the plurality of devices is connected to one or more of the ports.

3. The method according to claim 1, further comprising:
   determining whether the one device contains a parasitic capacitance impacting the electrical characteristic of the selected devices, wherein the determination of whether the one device impacts the electrical characteristic of the selected devices is further based on the determination of whether the one device contains the parasitic capacitance.

4. The method according to claim 1 comprising:
   determining an association between a first sub-circuit of the selected devices and a second sub-circuit, wherein the second electrical layout is generated to include one or more of the plurality of devices based on the second sub-circuit.

5. The method according to claim 4, wherein the ports are bond pads of the IC design, the method further comprising:
   determining whether a top level cell of the IC design that includes the first sub-circuit further includes the second sub-circuit, wherein the determined association is based on the determination of whether the top level cell further includes the second sub-circuit.

6. The method according to claim 1 comprising:
   determining the physical layout based on a third electrical layout for the IC design, the physical layout being configured to have an electrical performance indicated by the third electrical layout; and
   comparing the second and third electrical layouts.

7. The method according to claim 6 comprising:
   determining one or more electrical characteristics of a random-access memory (RAM) device of the plurality of devices according to the second electrical layout, the electrical characteristics including a threshold voltage, saturation current, noise margin, trench capacitance, or a combination thereof.

8. A system comprising:
   a first module configured to:
      generate a first electrical layout indicating an electrical performance of a physical layout for an integrated circuit (IC) design, the first electrical layout indicating a plurality of devices; and
   a second module configured to:
      select one or more of the plurality of devices based on one or more connections of the plurality of devices; and
   generate a second electrical layout indicating an electrical performance of the physical layout, the second electrical layout indicating the selected devices without at least one of the plurality of devices, wherein the second module is further configured to:
   determine whether one of the plurality of devices impacts an electrical characteristic of the selected devices, based on a determination of whether the one device is an active or passive device and/or contains a parasitic capacitance, wherein the second electrical layout is generated to include the one device based on the determination of whether the one device impacts the electrical characteristic of the selected devices.

9. The system according to claim 8, wherein the first electrical layout indicates a plurality of ports and the second module is further configured to:
   determine whether each of the plurality of devices is connected to one or more of the ports, wherein the selection of the one or more devices is further based on the determination of whether each of the plurality of devices is connected to one or more of the ports.

10. The system according to claim 8, comprising:
    a third module configured to generate the physical layout based on a third electrical layout, the physical layout being configured to have an electrical performance indicated by the third electrical layout; and
    a fourth module configured to compare an electrical performance indicated by the second and third electrical layout.

11. The system according to claim 10, comprising:
    a fifth module configured to determine one or more electrical characteristics of the physical layout based on the second electrical layout.

12. The system according to claim 11, wherein the electrical characteristics include a threshold voltage, saturation current, noise margin, trench capacitance, or a combination thereof of a random-access memory (RAM) device of the plurality of devices.

* * * * *